(12) United States Patent  (10) Patent No.: US 8,232,557 B2
Makabe et al.  (45) Date of Patent: Jul. 31, 2012

(54) SEMICONDUCTOR SUBSTRATE WITH ALGAN FORMED THEREON AND SEMICONDUCTOR DEVICE USING THE SAME

(75) Inventors: Isao Makabe, Yamanashi (JP); Ken Nakata, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 650 days.

(21) Appl. No.: 11/965,302

(22) Filed: Dec. 27, 2007

(65) Prior Publication Data

US 2008/0210949 A1    Sep. 4, 2008

(30) Foreign Application Priority Data

Dec. 27, 2006 (JP) .................. 2006-351436

(51) Int. Cl.
*H01L 29/205* (2006.01)

(52) U.S. Cl. .... 257/76; 257/101; 257/190; 257/E29.091

(58) Field of Classification Search .................. 257/76, 257/E29.091, 101, 190
See application file for complete search history.

(56) References Cited

U.S. PATENT DOCUMENTS

2005/0133816 A1* 6/2005 Fan et al. ............ 257/190
2006/0220039 A1* 10/2006 Yokoyama et al. ........ 257/85

FOREIGN PATENT DOCUMENTS

| JP | 2000-277441 A | 10/2000 |
| JP | 2004-524250 A | 8/2004 |
| WO | 02-48434 A2 | 6/2002 |

* cited by examiner

*Primary Examiner* — Hung Vu
*Assistant Examiner* — Vernon P Webb
(74) *Attorney, Agent, or Firm* — Westerman, Hattori, Daniels & Adrian, LLP

(57) ABSTRACT

A semiconductor substrate includes: an AlN layer provided on a silicon substrate; an AlGaN layer that is provided on the AlN layer and has an Al composition ratio of 0.3 to 0.6; and a GaN layer provided on the AlGaN layer.

4 Claims, 3 Drawing Sheets

SEMICONDUCTOR SUBSTRATE WITH ALGAN FORMED THEREON AND SEMICONDUCTOR DEVICE USING THE SAME

BACKGROUND OF THE INVENTION

1. Field of the Invention

The present invention generally relates to semiconductor substrates and semiconductor devices using the same. More particularly, the present invention relates to a semiconductor substrate having a gallium nitride (GaN) layer formed on a silicon (Si) substrate, and a semiconductor device such as a semiconductor substrate.

2. Description of the Related Art

Semiconductor devices using GaN are used as power devices operating at high frequencies and outputting high power, light-emitting diodes and laser diodes emitting lights of short wavelengths. Among these semiconductor devices, particularly, there has been considerable activity in the development of semiconductor devices capable of amplifying microwaves, quasi-millimeter waves or millimeter waves, such as high electron mobility transistors (HEMT), and light-emitting devices such as laser diodes (LD), light-emitting diodes and vertical cavity surface emitting laser diodes (VCSEL).

Generally, a sapphire substrate or silicon carbide (SiC) is used as a substrate for growing a GaN layer. Since the sapphire substrate and SiC substrate are expensive, an alternative technique for growing the GaN layer on a Si substrate has been developed. Silicon and gallium react easily. Thus, an aluminum nitride (AlN) layer is provided as a barrier layer between the Si substrate and the GaN layer. However, the GaN layer having good crystallinity cannot be obtained when the GaN layer is grown directly on the AlN layer. Japanese Patent Application Publication No. 2004-524250 discloses a technique taking the above into consideration in which an AlGaN layer is provided between the AlN layer on the Si substrate and the GaN layer and the Al composition continuously changes. Japanese Patent Application Publication No. 2000-277441 discloses a technique in which an AlGaN layer having a stepwise changing composition is provided between the AlN layer on the silicon substrate and the GaN layer.

However, the techniques disclosed in the above publications do not realize the GaN layer that is grown on the Si substrate and has good crystallinity. For example, a measurement result shows that the X-ray diffraction rocking curve full width at half-maximums (XRC-FWHM) of the (002) or (102) plane of a GaN layer formed on a Si substrate using the conventional technique ranges from 600 seconds to 800 seconds. Further, the substrate having the GaN layer grown on the Si substrate may have a crack on the surface or a warp due to the difference in thermal expansion coefficient between the GaN layer and the Si substrate.

SUMMARY OF THE INVENTION

The present invention has been made in view of the above-mentioned circumstances, and provides a semiconductor substrate having a GaN layer having improved crystallinity and reduced warp and a semiconductor device using such as a semiconductor substrate.

According to an aspect of the present invention, there is provided a semiconductor substrate including: an AlN layer provided on a silicon substrate; an AlGaN layer that is provided on the AlN layer and has an Al composition ratio of 0.3 to 0.6; and a GaN layer provided on the AlGaN layer.

According to another aspect of the present invention, there is provided a semiconductor device including: an AlN layer provided on a silicon substrate; an AlGaN layer that is provided on the AlN layer and has an Al composition ratio of 0.3 to 0.6; a GaN layer provided on the AlGaN layer; and an operating layer provided on the GaN layer.

DESCRIPTION OF THE PREFERRED EMBODIMENTS

A description will now be given of embodiments of the present invention with reference to the accompanying drawings.

First Embodiment

Figure 1A:
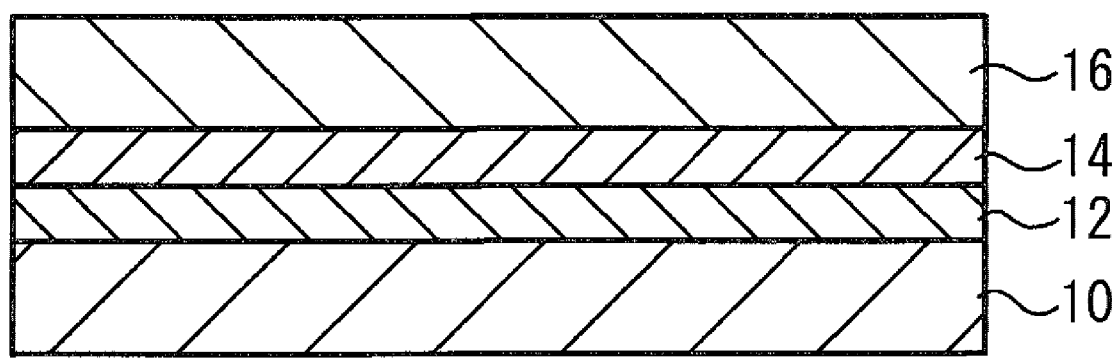
FIGS. 1A and 1B show a method for manufacturing a semiconductor device in accordance with a first embodiment.

A first embodiment will now be described with reference to FIGS. 1A and 1B. Referring to FIG. 1A, a surface oxide film on a Si substrate 10 is removed by hydrofluoric acid (HF). Next, the Si substrate 10 is placed in a reactor of metal organic chemical vapor deposition (MOCVD) apparatus. Then, the temperature of the Si substrate 10 is raised to 1050° C. by using hydrogen ($H_2$) gas as carrier gas. This thermally cleans the surface of the Si substrate 10. Then, trimethyl aluminum (TMA) and ammono ($NH_3$) are supplied to grow an AlN (aluminum nitride) layer 12 having a thickness of about 250 nm on the Si substrate 10. The AlN layer 12 is an almost lattice-relaxed layer because the Si substrate 10 is heated to 1050° C. Then, the temperature of the Si substrate 10 is raised to 1100° C., and TMA, trimethyl gallium (TMG) and $NH_3$ are supplied to grow an AlGaN (aluminum gallium nitride) layer 14 having a thickness of about 250 nm on the AlN layer 12. The Al composition ratio of the AlGaN layer 14 will be described later. Further, the Si substrate 10 is heated to 1150° C., and TMG and $NH_3$ are supplied to grow a GaN (gallium nitride) layer 16 having a thickness of about 1 μm on the AlGaN layer 14.

Figure 1B:
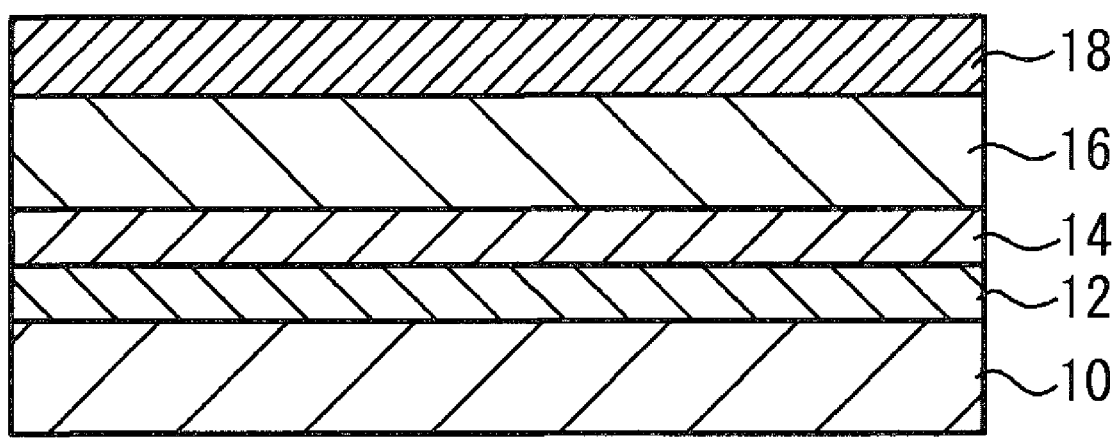

Referring to FIG. 1B, the temperature of the Si substrate 10 is decreased to 1050° C., and TMA, TMG and $NH_3$ are supplied to grow an AlGaN electron supply layer 18 on the GaN layer 16 in which the AlGaN electron supply layer 18 has a thickness of about 30 nm and an Al composition ratio of 0.25. The semiconductor substrate of the first embodiment formed using MOCVD is completed through the above-mentioned steps.

The inventors investigated the crystallinity of the GaN layer 16 when the AlGaN layer 14 has an Al composition ratio of 0.40 in the state shown in FIG. 1A by using the X-ray diffraction method. The XRC-FWHM of the (002) plane of the GaN layer 16 was 450 seconds and was excellent. In the case of the (102) plane of the GaN layer 16 shows 570 seconds and a very good value. Cracks or pits on the surface of the GaN layer 16 were not observed. Further, the inventors confirmed that the semiconductor substrate has only a small warp.

Figure 2:
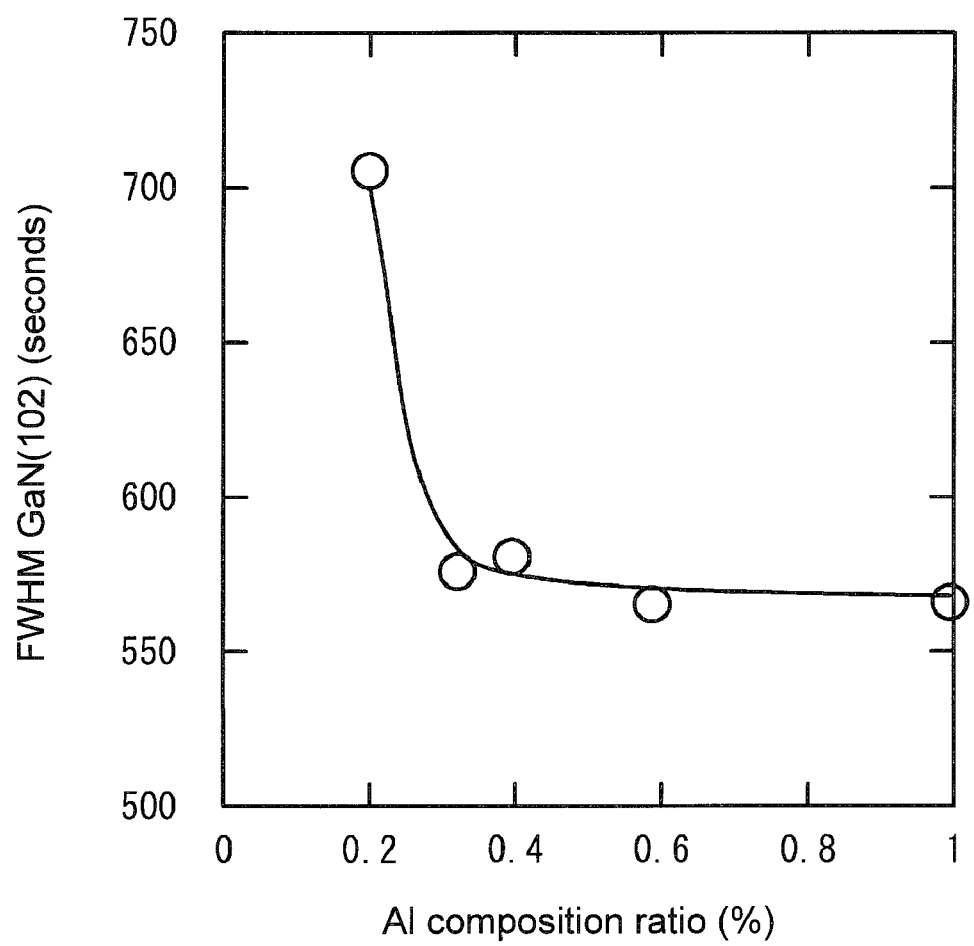
FIG. 2 is a graph of an X-ray diffraction rocking curve full width at half-maximums (XRC-FWHM) as a function of the Al composition ratio of an AlGaN layer.

FIG. 2 shows the XRC-FWHM of the (102) plane of the GaN layer 16 for different Al compositions of the AlGaN layer 14. The XRC-FWHM abruptly increases when the Al composition ratio is smaller than 0.3. It is thus possible that the Al composition ratio of the AlGaN layer 14 is equal to or greater than 0.3. When a sufficient production margin is ensured, it is preferable that the Al composition ratio of the AlGaN layer 14 is equal to or greater than 0.4.

Figure 3:
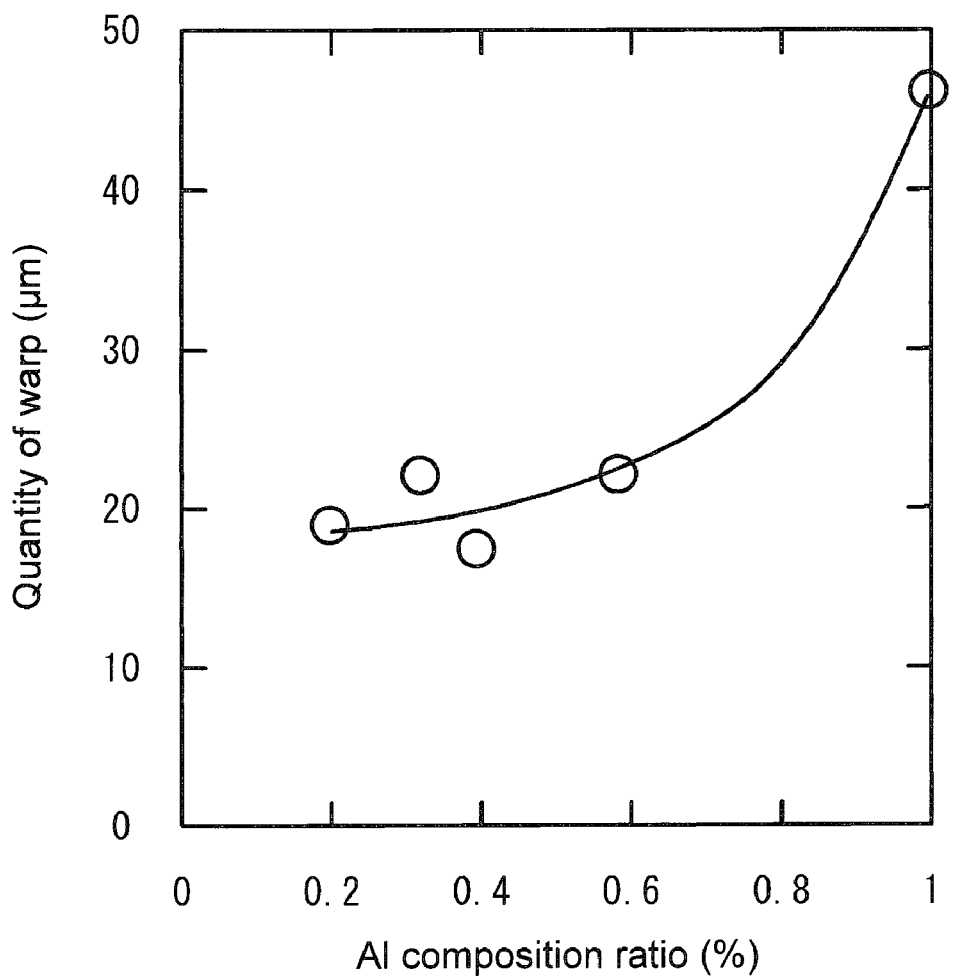
FIG. 3 is a graph of the quantity of warp of a semiconductor substrate as a function of the Al composition ratio of an AlGaN layer.

FIG. 3 shows the quantity of warp (μm) of the semiconductor substrate for different Al compositions of the AlGaN layer 14. The quantity of warp abruptly increases when the Al composition ratio exceeds 0.6. It is thus preferable that the Al composition ratio of AlGaN layer 14 is equal to or smaller than 0.6.

It is thus preferable that the Al composition ratio of the AlGaN layer 14 is equal to or greater than 0.3 and is equal to or smaller than 0.6. Through the above-mentioned consideration of the first embodiment, the inventors were able to obtain data shown in FIGS. 2 and 3 that were unknown in the past. Therefore, the inventors were able to realize the semiconductor substrate having improved crystallinity and reduced warp and semiconductor devices using the above semiconductor substrate.

It is well known that the growth rate of the AlGaN layer abruptly decreases when the Al composition ratio thereof increases. Thus, the conventional Al composition ratio of the AlGaN layer 14 formed between the AlN layer 12 and the GaN layer 16 was approximately equal to 0.2. However, according to FIG. 2, the XRC-FWHM of the GaN layer 16 with the Al composition ratio being approximately equal to 0.2 is about 700 seconds. Further, there is no report that shows the XRC-FWHM is equal to or less than 600 seconds when the Al composition of the AlGaN layer 14 is continuously or stepwise changed as described in the above-mentioned publications. The inventors found out that the crystallinity of GaN layer 16 can be improved by setting the Al composition ratio of the AlGaN layer 14 that is a single layer equal to or greater than 0.3.

When the Al composition ratio of the AlGaN layer 14 is set equal to or smaller than 0.6, warp of the wafer can be improved. When the Al composition ratio of the AlGaN layer 14 is set equal to or greater than 0.3, the crystallinity can be improved. These improvements may result from the following.

Table 1 show the linear thermal expansion coefficients (ppm/° C.) and lattice constants (nm) of Si, AlN, AlGaN (the Al composition ratio is 0.5), and GaN.

TABLE 1

| | Linear thermal expansion coefficient (ppm/° C.) | Lattice constants (nm) |
|---|---|---|
| GaN | 5.6 | 0.319 |
| AlGaN | 5.0 | 0.315 |
| AlN | 4.6 | 0.311 |
| Si | 3.6 | 0.384 |

Each layer is grown at a temperature approximately equal to 1100° C., and the semiconductor substrate is warped due to compressive stress resulting from the linear thermal expansion coefficient. Further, stress resulting from the difference in lattice constant is applied to each layer. As has been described, the AlN layer 12 is almost lattice-relaxed. Thus, tensile stress applied to the AlGaN layer 14 and the GaN layer 16 can compensate for compressive stress resulting from the thermal expansion coefficient. When the AlGaN layer has a relatively small Al composition ratio, there is great stress resulting from the difference in lattice constant between the AlN layer 12 and the AlGaN layer 14, and compressive stress resulting from the thermal expansion coefficient can be considerably compensated for. In contrast, when the AlGaN layer has a relatively large Al composition ratio, there is small stress resulting from the difference in lattice constant between the AlN layer 12 and the AlGaN layer 14, and compressive stress resulting from the thermal expansion coefficient cannot be considerably compensated for. It can be seen from the above that the semiconductor substrate may be warped when the Al composition ratio of the AlGaN layer 14 is great. Consequently, the Al composition ratio of the AlGaN layer 14 is preferably equal to or greater than 0.3 and is equal to or smaller than 0.6.

The crystallinity is improved as stress during growth is small (that is, lattice-relaxed). Thus, it is better that stress resulting from the difference in lattice constant is small. As has been described, lattice deformation in the AlN layer 12 is almost relaxed. Thus, the lattice constant of the upper surface of the AlN layer 12 is approximately equal to the lattice constant of AlN. Thus, when the Al composition ratio of the AlGaN layer 14 is small, large stress resulting from the difference in lattice constant is applied to the AlGaN layer 14 during growth, and crystallinity cannot be improved. In contrast, when the Al composition ratio of the AlGaN layer 14 is large, small stress resulting from the difference in lattice constant is applied to the AlGaN layer 14 during growth, and crystallinity can be improved.

The AlN layer 12 and the AlGaN layer 14 are preferably thick in terms of crystallinity. However, these layer are excessively thick, a crack may take place due to internal stress. Thus, it is preferable that each of the AlN layer 12 and the AlGaN layer 14 falls within a range of 250 nm±125 nm. Each of the AlN layer 12 and the AlGaN layer 14 may contain another atom with a composition ratio of about 1%. For example, In may be contained with an In composition ratio of 1% or less.

Preferably, the AlN layer 12 is a layer in which lattice deformation has been relaxed. As shown in Table 1, the AlN layer and the Si layer have quite different lattice constants. Thus, if lattice deformation of the AlN layer 12 is not relaxed, a crack may be produced in the AlN layer 12 due to internal stress. The lattice deformation of the AlN layer 12 may be relaxed by a method of forming the AlN layer 12 at a temperature equal to or higher than 1000° C., as in the case of the first embodiment. Other than the above method, there may be another method of raising or falling the temperature at which the AlN layer 12 is grown or yet another method of providing a buffer layer between the AlN layer 12 and the Si substrate 10. Any of the above methods may be used.

Second Embodiment

Figure 4:
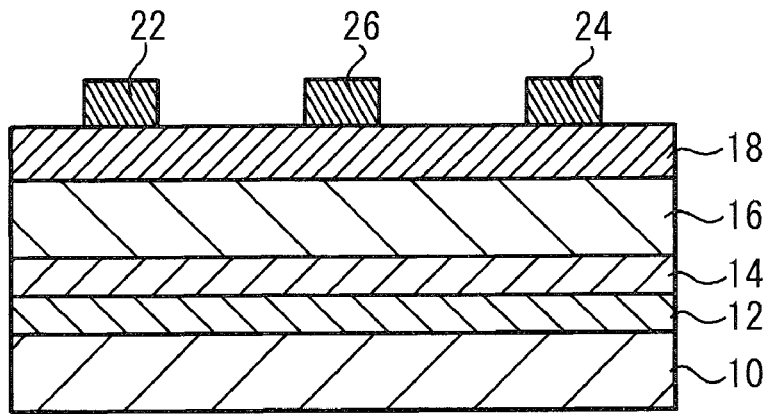
FIG. 4 is a cross-sectional view of a HEMT in accordance with a second embodiment.

A second embodiment is a HEMT using the semiconductor substrate of the first embodiment. As shown in FIG. 4, a source electrode 22 and a drain electrode 24, which are ohmic electrodes having a Ti/Au structure, are formed on the electron supply layer 18 of the semiconductor substrate of the first embodiment by evaporation. A gate electrode 26, which has a Ni/Au is formed on the electron supply layer 18 by evaporation. Through the above steps, the HEMT is completed. In the second embodiment, two-dimensional gas generated at an interface of the GaN layer 16 with the electron supply layer 18 and the electron supply layer 18 function as an operating layer through which carriers run.

The semiconductor device of the second embodiment has improved performance because it has the GaN layer having improved crystallinity and reduced warp. The semiconductor device may be optical semiconductor devices such as LD, LED and VCSEL other than FETs such as HEMT. These devices have improved performance because the crystallinity of the GaN is improved. In LD, LED or VCSEL, an active layer and a clad layer operate as an operating layer through which carriers run.

The present invention is not limited to the specifically disclosed embodiments, but other embodiments and variations may be made without departing from the scope of the present invention.

The present application is based on Japanese Patent Application No. 2006-351436 filed Dec. 27, 2006, the entire disclosure of which is hereby incorporated by reference.

What is claimed is:

1. A semiconductor device comprising:
an AlN layer provided on a silicon substrate;
an AlGaN layer that is provided directly on the AlN layer and has an Al composition ratio of 0.3 to 0.6;
a GaN layer provided directly on the AlGaN layer; and
an AlGaN electron supply layer provided on the GaN layer.

2. The semiconductor device as claimed in claim 1, wherein the AlN layer is formed at a temperature equal to or higher than 1000° C.

3. The semiconductor device as claimed in claim 1, wherein the AlN layer, the AlGaN layer and the GaN layer are formed by MOCVD.

4. The semiconductor device as claimed in claim 1, wherein the semiconductor device is one of HEMT, LD, LED and VCSEL.

* * * * *